United States Patent [19]
Giramma

[11] Patent Number: 5,706,476
[45] Date of Patent: Jan. 6, 1998

[54] METHOD AND APPARATUS FOR USE OF THE UNDEFINED LOGIC STATE AND MIXED MULTIPLE-STATE ABSTRACTIONS IN DIGITAL LOGIC SIMULATION

[75] Inventor: David J. Giramma, Portland, Oreg.

[73] Assignee: Synopsys, Inc., Mountain View, Calif.

[21] Appl. No.: 464,390

[22] Filed: Jun. 5, 1995

[51] Int. Cl.$^6$ .............................................. H01L 21/70
[52] U.S. Cl. ............................................ 395/500; 364/490
[58] Field of Search ........................... 395/500; 364/578, 364/488, 489, 490, 491; 371/25.1

[56] References Cited

U.S. PATENT DOCUMENTS

| | | | |
|---|---|---|---|
| 4,306,286 | 12/1981 | Cocke et al. . | |
| 4,587,625 | 5/1986 | Marino, Jr. et al. . | |
| 4,628,471 | 12/1986 | Schuler et al. | 364/578 |
| 4,725,971 | 2/1988 | Doshi et al. | 364/578 |
| 4,799,141 | 1/1989 | Drusinsky et al. . | |
| 4,907,180 | 3/1990 | Smith | 364/578 |
| 5,095,483 | 3/1992 | Dubler et al. | 371/25.1 |
| 5,191,541 | 3/1993 | Landman et al. . | |
| 5,253,363 | 10/1993 | Hyman et al. . | |
| 5,353,243 | 10/1994 | Read et al. | 364/578 |

OTHER PUBLICATIONS

*From Behavior to Structure: High–Level Synthesis*, R. Camposano, IEEE Design & Test of Computers, 1990.
*The Olympus Synthesis System*, Giovanni De Micheli et al., IEEE, Oct., 1990.

*Primary Examiner*—Kevin J. Teska
*Assistant Examiner*—Dan Fiul
*Attorney, Agent, or Firm*—Kolisch, Hartwell, Dickinson, McCormack & Heuser

[57] ABSTRACT

Method and apparatus for more efficiently using the undefined logic state and mixed multiple state abstractions is described. The method involves dividing gates into two groups: those that require an 8-state table (either because their inputs are sensitive to 8-state values or their output produces an 8-state value), and those that require only 4-state values (their inputs are insensitive to 8-state values and the output produces only 4-state values). The key to obtaining the advantages of the invention is the choice of the 4-state values. Previously, the 4-state values have been 0, 1, X, and Z. By the invented method and apparatus, the 4-state values are defined instead to be 0S, 1S, XS, and U. In the Multi-value Logic 9-state model (MVL-9), U is defined to be the uninitialized state, and thus it is a state that all instances need to process on their inputs and to produce as an output. The Z (or high-impedance) state, on the other hand, is used only for certain specialized gates—typically tri-state buffers—and so the Z state is used only rarely in digital logic simulation. By shifting the definition of the 4-state abstraction from (0, 1, X, Z) to (0S, 1S, XS, U), almost all gates may be included in the 4-state category, thus allowing higher pin counts for the average digital logic simulation. The invented method and apparatus nevertheless permits the interconnection of 4-state values and 8-state values, while placing the significant overhead of the latter on the rare use thereof. Preferably, both 4-state and 8-state directives—instructions to a downstream gate that tells the gate how to attain a new state—are provided by the invented method and apparatus, and the gate receiving such plural directives effectively decides whether to use the 4-state abstraction or the more expensive 8-state abstraction.

18 Claims, 3 Drawing Sheets

METHOD AND APPARATUS FOR USE OF THE UNDEFINED LOGIC STATE AND MIXED MULTIPLE-STATE ABSTRACTIONS IN DIGITAL LOGIC SIMULATION

TECHNICAL FIELD

The present invention relates generally to digital system simulation. More specifically, it concerns digital logic simulators that model the logic values of outputs of objects based upon state abstractions involving the objects' inputs and internal states. By object is meant any discretely modelled logic gate, circuit or system of any complexity, although typically an object includes only a few logic gates having relatively few inputs and corresponding outputs.

BACKGROUND ART

Often digital logic simulators include a simulation kernel for reading and processing a netlist, which consists of a list of simulatable models and the connections between them. Individual models within the logic simulator may describe relatively complex devices such as a field programmable gate array (FPGA) or a complex programmable logic device (CPLD), which typically is used with models of other devices, e.g. memories, microprocessors, etc., to simulate the behavior of the board or system. The simulation kernel performs a conventional event-driven simulation based upon the given description.

So-called state abstractions are used to model the logic values of an object. Typical state abstractions include:

- 2-state model of logic 0 and logic 1 (0,1);
- 3-state model of 0, 1, and logic unknown (0,1,X);
- 4-state model of 0, 1, X and high-impedance (0,1,X,Z);
- 9-state model of 0, 1, and X at strengths or values including strong, resistive, and high-impedance (0S,1S, XS,0R,1R,XR,0Z,1Z,XZ);
- 12-state model of 0, 1, and X at strengths or values including strong, resistive, high-impedance, and indeterminate (0S,1S,XS,0R,1R,XR,0Z,1Z,XZ,0I,1I,XI); and
- Multiple-Value Logic 9-state model (MVL-9) of 0, 1, X at strong and resistive strengths or values, as well as high-impedance, uninitialized, and undefined (0S,1S, XS,0R,1R,XR,Z,U,D).

In addition to these state abstractions, some logic simulators use a 3-state model coupled with essentially unlimited strengths or values. The choice of state abstraction—and the choice of how to represent that state abstraction—has a profound effect on simulation. For example, many simulators use truth tables to determine the next state of the output of a logic gate based upon the current state of the gate's pins, i.e. its logical interconnect nodes. The maximum allowed size of a truth table is a limiting factor in how many pins each gate can have in order for the simulator to fit within a given main memory of the simulation system.

Assuming that a truth table contains an entry for every combination of pin states, including the output pin, the number of entries in a truth table for various combinations of state abstraction and pin count is in accordance with Table 1:

TABLE 1

|  | 2 Pins | 4 Pins | 6 Pins | 8 Pins | 10 Pins | 12 Pins |
|---|---|---|---|---|---|---|
| 4-state | 16 | 256 | 4K | 64K | 1024K | 6384K |
| 8-state | 64 | 4K | 256K | 16384K | 1048576K | 67108864K |

Most modern workstations, such as workstation 10 shown in FIG. 1, on which simulations typically are performed, have on the order of 32000K bytes of main memory. Thus, the size of a truth table must be limited so that it does not consume a significant portion of the available memory. Although it is practical to support 8- and 9-pin gates for a 4-state abstraction, it is not practical to go beyond 6-pin gates for an 8-state abstraction. Simulators that rely on truth table evaluation and that use an 8-state (or greater) abstraction must map large pin count functions into networks of smaller pin-count functions, thereby increasing the instance and event counts. As a result, a digital logic simulator's capacity and thus performance heretofore are compromised.

DISCLOSURE OF THE INVENTION

The invented method and apparatus in its preferred embodiment defines a modified MVL-9 model, with the modification being that the D state of the MVL-9 9-state model outlined above is not supported. The fact that it is based upon truth table functions as its principle primitive type would lead one to believe that the 8-state tables represent a limiting factor on the maximum gate pin count that is supportable. In accordance with invention, however, the limiting factor instead is the size of the 4-state tables. This is made possible by dividing gates into two groups: those that require an 8-state table (either because their inputs are sensitive to 8-state values or their output produces an 8-state value), and those that require only 4-state values (their inputs are insensitive to 8-state values and the output produces only 4-state values). The key to obtaining the advantages of the invention is the choice of the 4-state values.

Previously, the 4-state values have been chosen to be 0, 1, X, and Z. By the invented method and apparatus, the 4-state values are defined instead to be 0S, 1S, XS, and U. In the VHDL abstraction, U is defined to be the uninitialized state, and thus it is a state that all instances need to process at their inputs and to produce as an output. The Z (or high-impedance) state, on the other hand, is used only for certain specialized gates—typically tri-state buffers—so that the Z state is used only rarely in digital logic simulation. By shifting the definition of the 4-state abstraction from (0,1, X,Z) to (0S,1S,XS,U), almost all gates may be included in the 4-state category, thus allowing higher pin counts for the average digital logic simulation. The invented method and apparatus nevertheless permits the interconnection of 4-state values and 8-state values, while placing the significant overhead of the latter on the rare use thereof. Preferably, both 4-state and 8-state directives—instructions to a downstream gate that tells the gate how to attain a new state—are provided by the invented method and apparatus, and the gate receiving such plural directives decides whether to use the 4-state abstraction or the more expensive 8-state abstraction. The result is that much higher pin counts are supportable, as the more prominent 4-state gates use an efficient 4-state table format, while the rarer 8-state gates burden the relatively fewer users thereof.

These and additional objects and advantages of the present invention will be more readily understood after consideration of the drawings and the detailed description of the preferred embodiment.

DETAILED DESCRIPTION OF THE PREFERRED EMBODIMENT AND BEST MODE OF CARRYING OUT THE INVENTION

Figure 1:
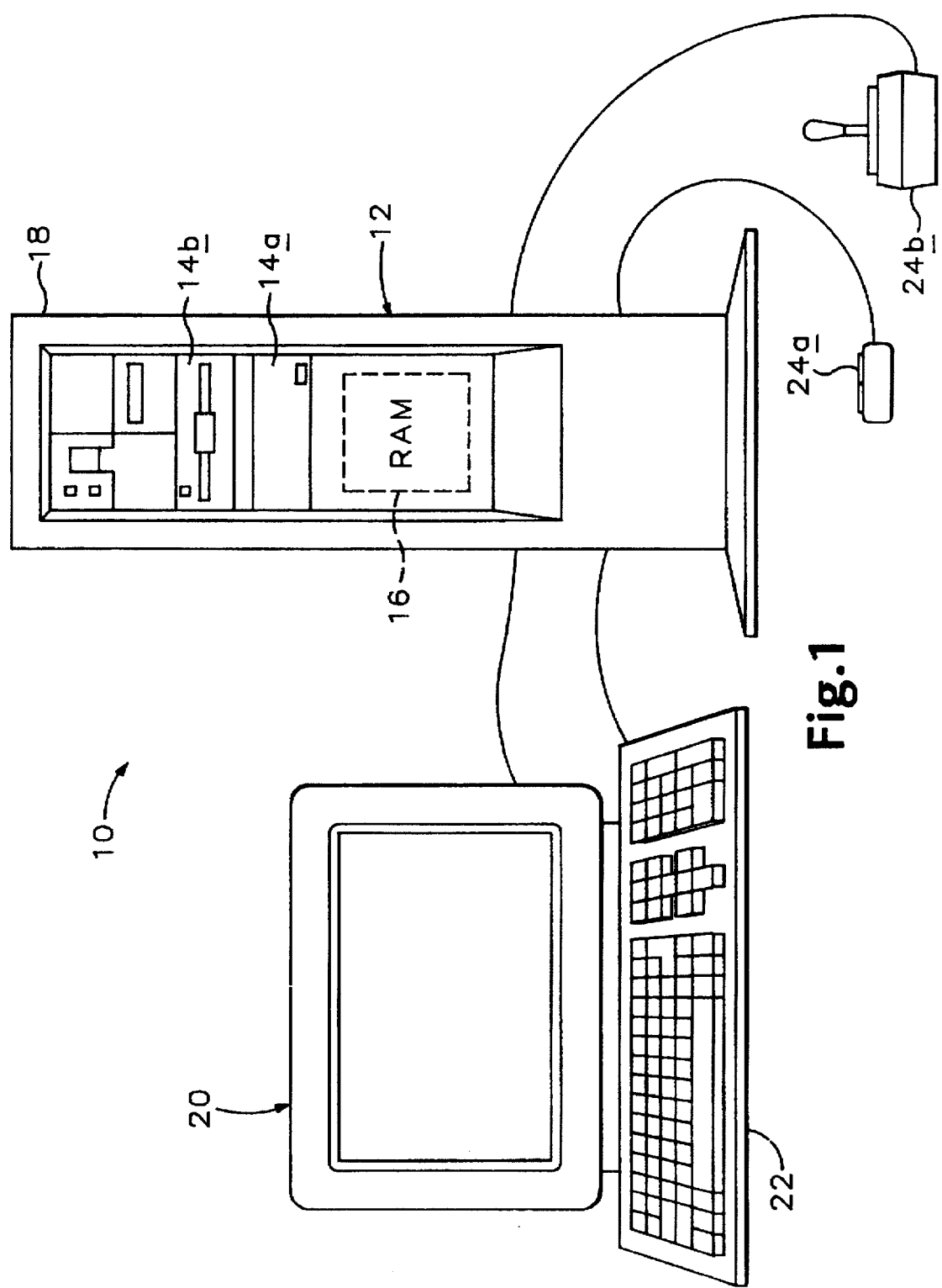
FIG. 1 is a conventional engineering workstation that may act as a hardware/firmware platform for a digital logic simulator and invented method and apparatus which forms a part thereof.

Referring first to FIG. 1, those of skill in the pertinent arts will appreciate that a digital logic simulator typically is a software application executing on an engineering workstation 10 or other general-purpose computer typically providing a digital processor 12 containing an arithmetic logic unit (ALU) and various registers typically including register stacks, scratchpad memories and accumulators. Skilled persons also will appreciate that the workstation also typically will provide for mass data storage, e.g. a hard or flex disk drive 14a, 14b, or both, as well as a quantity of read-and-write semiconductor memory (RAM) 16 (shown in outline as residing within workstation 10 and its housing 18) in which such application programs reside for execution by processor 12. Finally, skilled persons will appreciate that the workstation also typically will provide a display means such as a video display terminal (VDT) 20, a keyboard 22 and an associated display cursor control system 24 including, for example, a mouse or joystick 24a, 24b, or both. Within the spirit and scope of the invention, such a workstation may be equipped with specialized hardware that accelerates the digital logic simulation process, or the digital logic simulator itself may be a special-purpose processor that is a combination of hardware and firmware dedicated to the task of digital logic simulation. All such conventional hardware, firmware and software-executing-on-a-hardware/firmware platform architectures for a digital logic simulator are contemplated, and all are within the spirit and scope of the invention.

Figure 2:
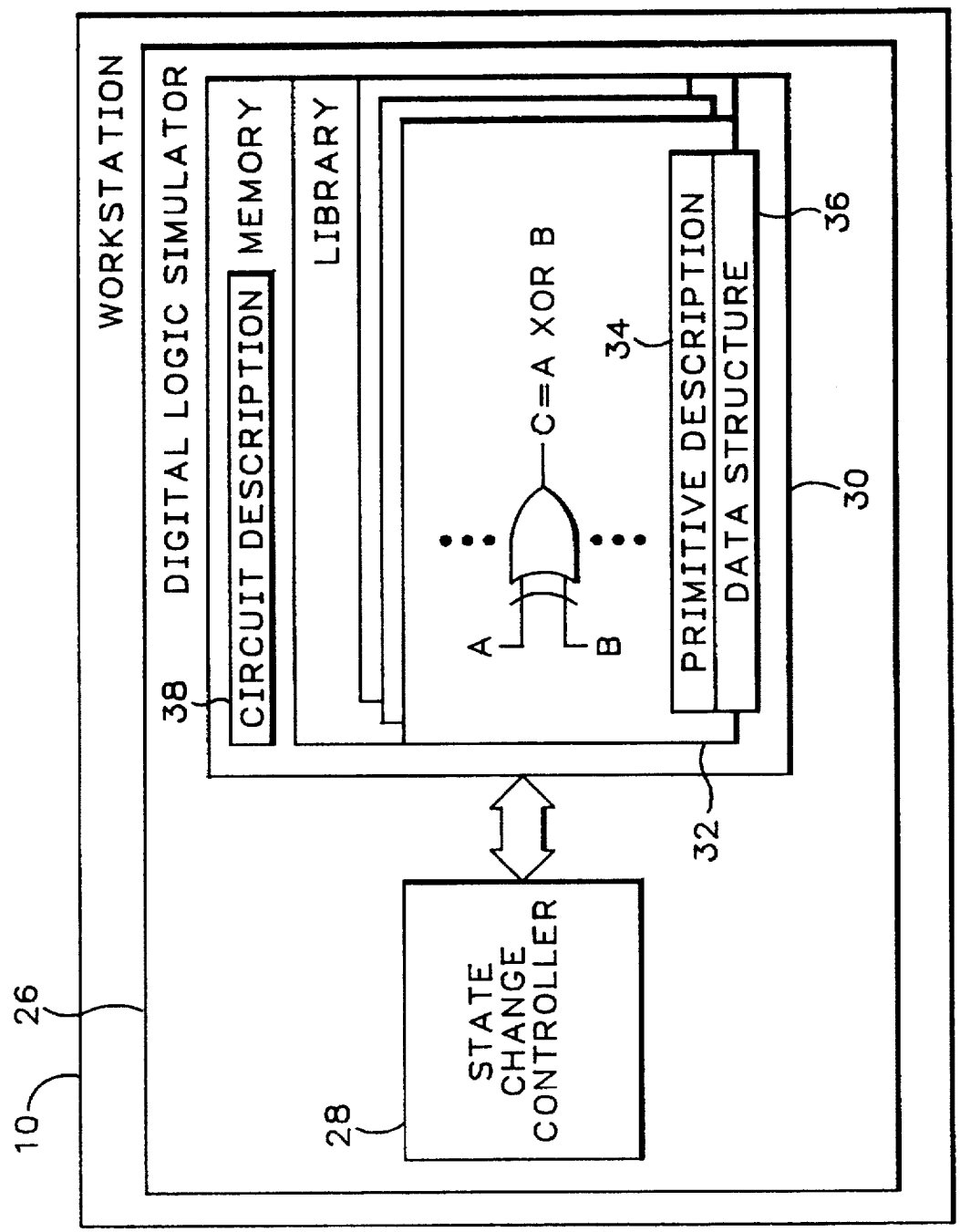
FIG. 2 is a system block diagram of the digital logic simulator of which the invented method and apparatus form a part.

Turning next to FIG. 2, a digital logic simulator 26 of which the invented method and apparatus form a part is illustrated in system block diagram form. Simulator 26 may be seen to include a state change controller 28 and a memory 30, with memory 30 including a library 32 containing descriptions of plural logic gates such as XOR logic gate 34 having m-state and n-state abstractions, where m is less than n. (Those of skill will appreciate that state change controller 28 may be a dedicated processor or may simply be digital processor 12 configured to perform the required functions of state change controller 28 to be further described herein, and that memory 30 may be a dedicated or selected portion of RAM 16 or a data segment within disk drive 14a or 14b, of workstation 10 shown in FIG. 1.) A simulation based upon a user-defined system or circuit description, e.g. a netlist, may be performed by simulator 26.

It will be appreciated that m-state and n-state abstractions, while not illustrated in FIG. 2, are as discussed above, where preferably m=4 and n=8, although any number and type of different state abstractions may be used within the spirit and scope of the invention. Preferably, a 4-state abstraction uses values 0S, 1S, XS and U, and the 8-state abstraction uses values 0S, 1S, XS, U, 0R, 1R, XR and Z, although of course other values of 4-state and 8-state abstractions are contemplated and are within the spirit and scope of the invention. Those skilled in the art will appreciate that library 32 typically would contain tables that represent the boolean logic function of the various primitives or gates, as well as defining the former-state, transition and next-state values for the primitives' input(s) and output(s), and that, in accordance with the invented method and apparatus, primitives having both m-state and n-state abstractions would be so-defined and characterized within bitfield arrays and/or tables within library 32 residing in memory 30.

The invented apparatus now may be understood by those skilled in the art. The invented apparatus is for use in a digital logic simulator including a memory-based library 32 of logic primitives (presented in FIG. 2 as an XOR gate), wherein the logic primitives are described by a former-state value for an input pin and an input transition-based next-state value for an output corresponding thereto. The apparatus permits the representation by a digital logic simulator user of logic primitives having mixed multiple-state abstractions. Preferably, the apparatus includes a memory-based primitive description 34 of at least one primitive having an m-state abstraction and of at least one primitive having an n-state abstraction, wherein m is less than n; a memory-based data structure 36 (represented in FIG. 2 by a box that spans library 32 and memory 30) defining a next-state value directive for an output of a primitive having an m-state abstraction and also defining a next-state value directive for an output of a primitive having an n-state abstraction (data structure 36 to be described).

The apparatus further includes a circuit description 38 defining a connection between an output of a first instance of the primitive having an m-state abstraction and an input of a second instance of a primitive having an m-state abstraction, the circuit description further defining a connection between the output of the first instance and an input of a first instance of a primitive having an n-state abstraction (description 38 typically being in the form of a netlist); and a state change controller 28 for determining the next-state values of the inputs of the second m-state abstraction primitive instance and the first n-state abstraction primitive instance, the controller basing such determination at least in part upon whether the input-connected primitive has an m-state abstraction or an n-state abstraction.

As described above, in accordance with a preferred embodiment, m=4 and wherein the 4-state abstraction does not include a high-impedance state described above as high-impedance state Z that is common to tri-state buffering devices or primitives. More preferably, the 4-state abstraction includes an uninitialized state such as uninitialized state U described above. Also preferably, the 4-state abstraction includes an undefined state such as undefined state XS described above. Typically, and as is common with prior art digital logic simulators, n=8 and the 8-state abstraction includes a high-impedance state such as high-impedance state Z common to tri-state buffering devices or primitives.

Preferably, the determining performed by the state change controller includes mapping the high-impedance state of the eight-state abstraction into the undefined state of the four-state abstraction, as is described above by the use of zoom words, tables and plural directive bitfields residing in memory. Also preferably, the four-state abstraction includes one or more strong states and the eight-state abstraction includes one or more resistive states, and wherein such mapping includes mapping at least one of the resistive states into at least one of the strong states. Most preferably, the state change controller produces one or more next-state directives (two in the case of 8-state abstractions) to the first n-state abstraction instance, wherein at least one of the next-state directives is based upon an m-state abstraction and wherein at least one of the next-state directives is based upon an n-state abstraction. It is this plural-directive production technique that enables any downstream connected primitive to determine the state of its input, whether the primitive is connected to an upstream primitive having a like or a different state abstraction, i.e. regardless whether the upstream primitive has an m-state abstraction or an n-state abstraction.

Those of skill in the art will appreciate that by directive production is meant any technique for signaling or otherwise communicating to a downstream connected primitive the possible next-state of its inputs based upon a transition of state of an output of an upstream primitive. Such signaling includes, in the case there exists no 8-state directive (as indicated by the zero contents of the 8-state directive bitfield), causing the simulator to heed instead the 4-state directive. In accordance with the preferred embodiment of the invention disclosed herein, table look-up methods are used whereby former-state, transition and next-state logic is maintained at one or more base addresses and bits or bitfields therein are accessed by the state change controller by indexing the base address with fixed offsets or bit-locating increments. It will be understood that state change controller 28 preferably is implemented in software residing in memory and executed by processor 12 of workstation 10, as described above and illustrated in FIG. 2.

With an understanding of the invented method and apparatus, it now may be appreciated that the invention represents a significant improvement over conventional digital logic simulators. The improvement may be thought of as an improvement useful in a digital logic simulator that includes a library of logic gates having n-state abstractions. The improvement in this context includes augmenting such a library with logic gates having m-state abstractions, where m is less than n, and mapping selected gates having n-state abstractions to produce interconnected gates having m-state abstractions. This permits simulation of digital logic circuitry wherein there are interconnections between one or more gates having n-state abstractions and one or more gates having m-state abstractions. The mapping step will be better understood by reference below to FIG. 3, and the augmenting step will be understood to be a matter of defining new gates within an existing library, wherein the new gates are characterized by m-state abstractions, e.g. by defining bitfields and table formats that correspond with 4-state values for each supported primitive or gate.

Preferably, the mapping step is performed by issuing plural directives to such interconnected gates having m-state abstractions, one of which directives is an m-state directive and the other of which directives is an n-state directive. Also in accordance with the preferred embodiment of the invention, the directives-issuing step includes mapping (translating), or converting, resistive values of gates having n-state abstractions, e.g. the 0R, 1R and XR values of the 8-state abstraction, to strong values of gates having m-state abstractions, e.g. the 0S, 1S and XS values of the invented 4-state abstraction (respectively). Further in accordance with the preferred embodiment of the invention, the directives-issuing step includes mapping (translating), or converting, high-impedance values of gates having n-state abstractions, e.g. the Z value of the 8-state abstraction, to strong undefined values of gates having m-state abstractions, e.g. the XS value of the 4-state abstraction. Most preferably, as described above, both mappings, or conversions, are performed as a part of the directives-issuing step.

In accordance with the preferred embodiment of the invention, the numerical values used to represent the eight states of the 8-state abstraction are summarized in Table 2:

TABLE 2

| State | Decimal Value | Binary Value |
|---|---|---|
| 0S | 0 | 000 |
| 1S | 1 | 001 |
| XS | 2 | 010 |
| U | 3 | 011 |
| 0R | 4 | 100 |
| 1R | 5 | 101 |
| XR | 6 | 110 |
| Z | 7 | 111 |

It may be seen from TABLE 2 that the eight states are simply ordinarily numbered and binary coded into a 3-bit field capable of storage in digital memory 30.

The 4-state directives that are derived from an 8-state directive and the old state of the output are represented in the following Table 3:

TABLE 3

| Next State | 8-State Directive | | | | | | | |
|---|---|---|---|---|---|---|---|---|
| | 000 | 001 | 010 | 011 | 100 | 101 | 110 | 111 |
| 0S | 000 | 001 | 010 | 011 | 000 | 001 | 010 | 010 |
| 1S | 000 | 001 | 010 | 011 | 000 | 001 | 011 | 011 |
| XS | 000 | 001 | 010 | 011 | 000 | 000 | 010 | 011 |
| U | 000 | 001 | 010 | 011 | 001 | 001 | 010 | 011 |
| 0R | 000 | 001 | 010 | 010 | 000 | 001 | 010 | 011 |
| 1R | 000 | 001 | 011 | 011 | 000 | 001 | 010 | 011 |
| XR | 000 | 000 | 010 | 011 | 000 | 001 | 010 | 011 |
| Z | 000 | 000 | 011 | 011 | 001 | 000 | 011 | 010 |
| 8-State-to-4-State Directive Map | | | | | | | | |

Those skilled in the art will understand from TABLE 3 that the tabulated three-bit fields represent 4-state directives that are 'sent' by state change controller 28 to inform simulator 26 of the next state of a downstream 4-state logic gate's input, based upon the current state of an upstream 8-state logic gate's output. It may be seen that, although three bits are used to code the directives, only the two least significant bits (LSBs) of the bitfield are high in any case. It is these two LSBs that effectively direct the simulator to evaluate the downstream 4-state logic gate's next input state.

Those skilled in the art will appreciate that 32-bit 'zoom' words, in accordance with the preferred embodiment of the invention, are used to obtain indices into various tables for next-state logic evaluations. Such zoom words contain defined bitfields including a pointer to the base address of a look-up table, input(s) and a corresponding output. The last of these bitfields effectively pinpoints offsets into the look-up table where next-state directives may be found. These next-state directives are defined such that, when exclusive ORd (XORd) with the former state of a downstream input produce the next state of the downstream input. The use of zoom words in the preferred embodiment of the present invention forms no part of the invention, however, and any suitable upstream-to-downstream change propagation and evaluation means may be used within the spirit and scope of the invention. Thus, it will be understood that state change controller 28 and data structure 36 are implemented preferably in memory by way of software writing and reading memory locations and using look-up table values for next-state variables in accordance with the rules and to perform the functions described and illustrated herein. Within the spirit and scope of the invention, however, state change controller may be firmware- or hardware-assisted or implemented by other suitable means.

The invented computer-assisted logic gate simulation method in its preferred embodiment is for simulating a circuit that includes plural logic gates characterized by differing output state abstractions. It may be seen by reference to FIG. 3 that, in a preferred embodiment of the invention, the method starting at 100 includes 1) at action block 102, classifying plural logic gates into two categories a first one of which is representable by substantially fewer abstraction states than a second one of such categories; 2) at 104, modeling a system by defining interconnections among such classified plural logic gates, including at least one interconnection between a logic gate in the first category and a logic gate in the second category; and 3) at action block 106 (indicated in dashed outline), performing a simulation of the modeled system. The invented simulation method ends at 108.

Preferably, the performing of the simulation includes at 106a predicting the next output state of a given gate and generating an appropriate directive to downstream connected, and thus affected, gate inputs; mapping at 106b (also indicated in dashed outline) from an output of the interconnected logic gate in the first category into an input of the interconnected logic gate in the second category; and sending at 106c one or more next-state directives to the receiving input(s) of a logic gate in the second category. It will be appreciated that all such steps may be performed on engineering workstation 10, and typically would involve state change controller 28 and the execution of software or firmware stored in RAM 16.

Preferably, the first category of plural logic gates includes a four-state abstraction and the second category of plural logic gates includes an eight-state abstraction, as described above. As discussed above, it is preferable that the four-state abstraction includes an uninitialized state U. This is believed to be preferable to using a four-state abstraction that includes only an undefined state X and a high-impedance state Z, for the reasons discussed above, although it will be appreciated that such is within the spirit and scope of the invention. Also preferably, the eight-state abstraction includes a high-impedance state Z, as discussed above. Preferably, the four-state abstraction does not include a high-impedance state. This novel approach thus places the burden of the rarer simulation need on the rare user of high-impedance states, i.e. tri-state bus designers.

Figure 3:
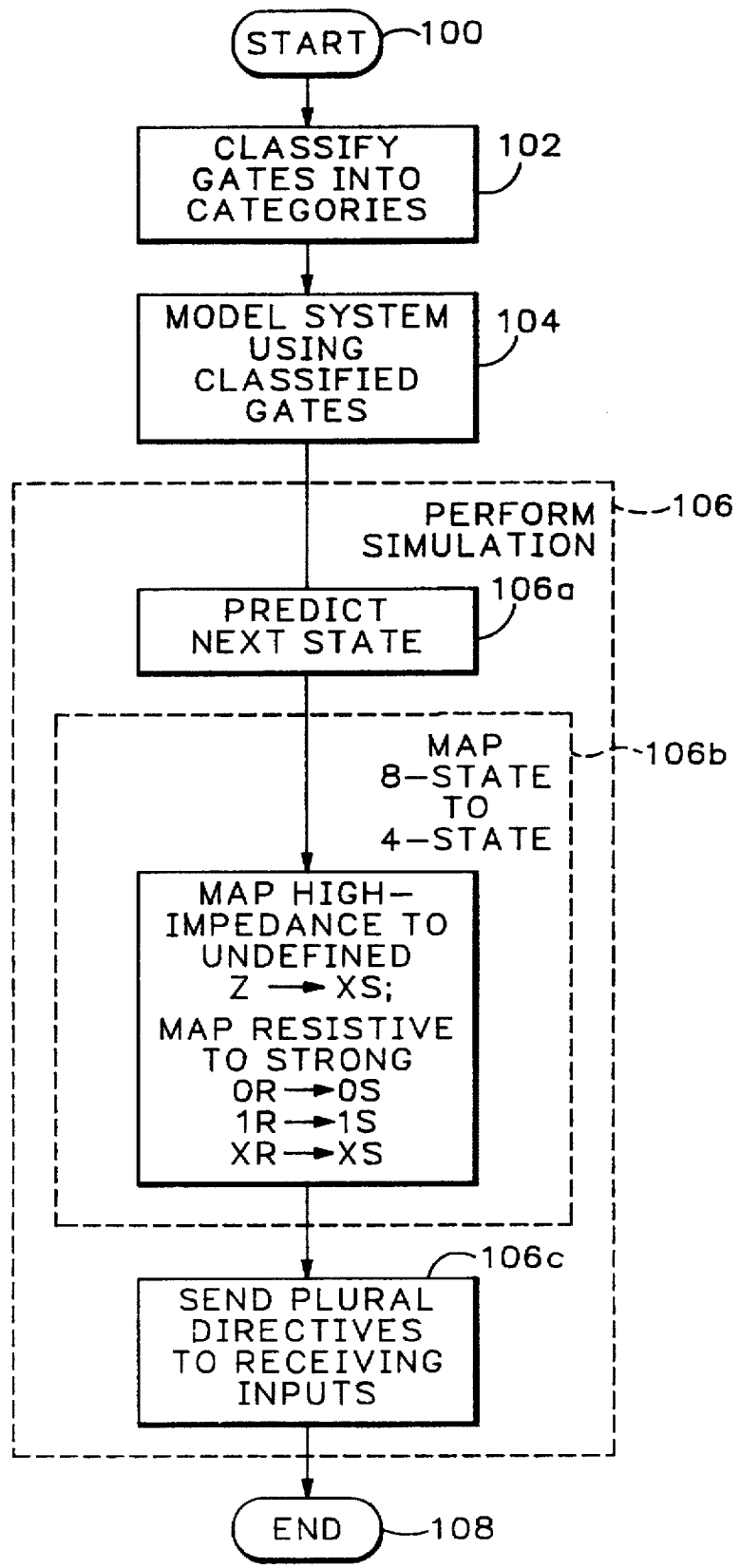
FIG. 3 is a flowchart illustrating the preferred method of the invention.

Referring still to FIG. 3, preferably mapping step 106b includes mapping high-impedance state Z of the eight-state abstraction into undefined state XS of the four-state abstraction. Preferably, the four-state abstraction includes one or more strong states, e.g. strong states 0S, 1S, XS, and wherein the eight-state abstraction includes one or more resistive states, e.g. 0R, 1R, XR, and mapping step 106b preferably further includes mapping at least one of the resistive states into at least one of the strong states, e.g. mapping a transition to/from resistive state 0R into strong state 0S, mapping resistive state 1R into strong state 1S and mapping resistive state XR into strong state XS, as described. Stop 108 will be understood to indicate the end of the method, although of course within the spirit and scope of the invention, the illustrated process may be repeated or restarted with a different gate or primitive classification, a new system model, etc.

Importantly, in accordance with the preferred method of the invention, mapping step 106b includes sending more than one, e.g., two, next-state directives to a logic gate in the second category when the output of such logic gate is interconnected to a logic gate in the first category. Such dual next-state directives are managed in accordance with various output and input evaluation rules that are enforced by digital simulator 26. The two rules for output gates are:

If 8-state gate, then broadcast both the 8-state and the 4-state directive; and

If 4-state gate, then broadcast only the 4-state directive.

The rules for input gates are:

If 4-state gate, then heed 4-state directive; and

If 8-state gate, then heed 8-state directive, if it exists, else heed 4-state directive.

The last (input) rule, it will be appreciated, requires that when no 8-state directive exists, the entry in the 8-state directive table in memory must be initialized and maintained at zero. In this way, the test implicit in the second input rule for the existence of an 8-state directive very simply is a conditional branch such as jump on zero. Those of skill in the art will appreciate that by broadcast it is meant that the simulator writes, or updates, a dedicated globally-accessible directive bitfield in memory, and by heed it is meant that the simulator reads and acts on the dedicated globally-accessible directive bitfield. Such global variable use is but one method of sending and receiving directives, and it will be appreciated that any suitable signalling mechanism, e.g. the use of semaphores, mailboxes, dedicated memory locations, dedicated registers, etc., all are within the spirit and scope of the invention.

The invention will be understood by those skilled in the art to obtain the significant advantage that larger pin counts are supportable on typical logic gates or primitives because of the more efficient 4-state table format, while the rarer 8-state logic gates are supported at only a marginal overhead cost that is borne only by users of the less efficient 8-state table format.

The invented method and apparatus permit a user of a digital logic simulator to mix 4-state and 8-state primitives throughout a circuit or system design in an arbitrary manner. Importantly, the invented embodiment is optimized around 4-state primitives, which are more common by far. No overhead penalty is incurred for the use of 4-state primitives, even when 8-state processing takes place, and only a small overhead penalty accrues to the use of 8-state primitives when 4-state processing occurs, i.e. generating a 4-state directive on outputs and checking for an 8-state directive on inputs.

Accordingly, while the present invention has been shown and described with reference to the foregoing preferred method and apparatus, it will be apparent to those skilled in the art that other changes in form and detail may be made therein without departing from the spirit and scope of the invention as defined in the appended claims.

I claim:

1. A computer-assisted logic gate simulation method for simulating a circuit that includes plural logic gates characterized by differing output state abstractions, the method comprising:

classifying plural logic gates into two categories a first one of which is representable by fewer abstraction states than a second one of such categories wherein the first category includes an uninitialized logic state as one of its defined states;

modeling a system by defining interconnections among such classified plural logic gates, including at least one interconnection between a logic gate in the first category and a logic gate in the second category; and performing a simulation of the modeled system, said performing including a mapping from an output of the interconnected logic gate in the first category into an input of the interconnected logic gate in the second category and sending one or more next-state directives to the logic gate in the second category.

2. The method of claim 1, wherein such first category of plural logic gates includes a four-state abstraction and such second category of plural logic gates includes an eight-state abstraction.

3. The method of claim 2, wherein the four-state abstraction includes an undefined state.

4. The method of claim 3, wherein the eight-state abstraction includes a high-impedance state.

5. The method of claim 4, wherein said mapping includes mapping the high-impedance state of the eight-state abstraction into the undefined state of the four-state abstraction.

6. The method of claim 5, wherein the four-state abstraction includes one or more strong states and wherein the eight-state abstraction includes one or more resistive states, and wherein said mapping includes mapping at least one of the resistive states into at least one of the strong states.

7. The method of claim 1, wherein said mapping includes sending more than one next-state directive to a logic gate in the second category when the output of such logic gate is interconnected to a logic gate in the first category.

8. In a digital logic simulator including a library of logic gates having n-state abstractions, the improvement comprising:

augmenting the library with logic gates having m-state abstractions, where m is less than n, wherein the m-state abstractions do not include a high-impedance state as one of their m defined states, and mapping selected gates having n-state abstractions to produce interconnected gates having m-state abstractions, thereby to permit simulation of digital logic circuitry wherein there is interconnection between one or more gates having n-state abstractions and one or more gates having m-state abstractions.

9. The improvement of claim 8, wherein said mapping is performed by issuing plural directives to such interconnected gates having m-state abstractions, one of which directives is an m-state directive and the other of which directives is an n-state directive.

10. The improvement of claim 9, wherein said directives-issuing step includes converting resistive values of gates having n-state abstractions to strong values of gates having m-state abstractions.

11. The improvement of claim 9, wherein said directives-issuing step includes converting high-impedance values of gates having n-state abstractions to strong undefined values of gates having m-state abstractions.

12. The improvement of claim 9, wherein said directives-issuing step includes converting resistive values of gates having n-state abstractions to strong values of gates having m-state abstractions, and wherein said directives-issuing step includes converting high-impedance values of gates having n-state abstractions to strong undefined values of gates having m-state abstractions.

13. For use in a digital logic simulator including a library of logic primitives, wherein the logic primitives are described by a former-state value for an input pin and an input transition-based next-state value for an output pin corresponding thereto, apparatus for representing logic primitives having mixed multiple-state abstractions, said apparatus comprising:

a memory-based description of at least one primitive having an m-state abstraction and of at least one primitive having an n-state abstraction, wherein m is less than n and wherein the m-state abstraction includes an uninitialized logic state as one of its m defined states;

a memory-based data structure defining a next-state value directive for an output of a primitive having an m-state abstraction and also defining a next-state value directive for an output of a primitive having an n-state abstraction;

a circuit description defining a connection between an output of a first instance of the primitive having an m-state abstraction and an input of a second instance of a primitive having an m-state abstraction, said circuit description further defining a connection between the output of the first instance and an input of a first instance of a primitive having an n-state abstraction;

a state-change controller for determining the next-state values of the inputs of the second m-state abstraction primitive instance and the first n-state abstraction primitive instance, said controller basing such determination at least in part upon whether the input-connected primitive has an m-state abstraction or an n-state abstraction.

14. The apparatus of claim 13, wherein the four-state abstraction includes an undefined state.

15. The apparatus of claim 13, wherein m is four, wherein n is eight and wherein the eight-state abstraction includes a high-impedance state.

16. The apparatus of claim 15, wherein such determining by said state-change controller includes mapping the high-impedance state of the eight-state abstraction into the undefined state of the four-state abstraction.

17. The apparatus of claim 15, wherein the four-state abstraction includes one or more strong states, wherein the eight-state abstraction includes one or more resistive states, and wherein such mapping includes mapping at least one of the resistive states into at least one of the strong states.

18. The apparatus of claim 13, wherein said state-change controller produces two or more next-state directives to the first n-state abstraction instance, wherein at least one of said next-state directives is based upon an m-state abstraction and wherein at least one of said next-state directives is based upon an n-state abstraction.

* * * * *